US005122754A

United States Patent [19]

Gotaas

[11] Patent Number: 5,122,754

[45] Date of Patent: Jun. 16, 1992

[54] SENSOR FOR VERIFICATION OF GENUINENESS OF SECURITY PAPER

[75] Inventor: Einar Gotaas, Oslo, Norway

[73] Assignee: Inter Marketing OY, Finland

[21] Appl. No.: 572,960

[22] PCT Filed: Mar. 10, 1989

[86] PCT No.: PCT/FI89/00043

§ 371 Date: Oct. 30, 1990

§ 102(e) Date: Oct. 30, 1990

[87] PCT Pub. No.: WO89/08898

PCT Pub. Date: Sep. 21, 1989

[30] Foreign Application Priority Data

Mar. 10, 1988 [NO] Norway .................................. 881060

[51] Int. Cl.[5] .............................................. G01R 27/26

[52] U.S. Cl. .................................... 324/676; 324/663; 324/671; 324/677; 324/678; 324/686; 194/206; 194/213

[58] Field of Search ............... 324/663, 671, 672, 676, 324/677, 678, 686, 690; 194/206

[56] References Cited

U.S. PATENT DOCUMENTS

| | | | |
|---|---|---|---|
| 3,764,899 | 10/1973 | Peterson et al. | 324/672 X |
| 3,815,021 | 6/1974 | Kerr | 324/663 |
| 4,099,118 | 7/1978 | Franklin et al. | 324/676 X |
| 4,642,555 | 2/1987 | Swartz et al. | 324/677 |

*Primary Examiner*—Kenneth A. Wieder
*Assistant Examiner*—Glenn W. Brown
*Attorney, Agent, or Firm*—Lyon & Lyon

[57] ABSTRACT

A method and a device for automatic verification of genuineness of a banknote or a document comprising a watermark is described. A two-part, doubly active capacitive sensor device (4, 6, 7) is used. A symmetry property of the sensor output signal is changed in a predetermined manner when a correct watermark is present in a coinciding position with shape-adapted capacitor electrodes (4, 6).

50 Claims, 2 Drawing Sheets

Figure 5:
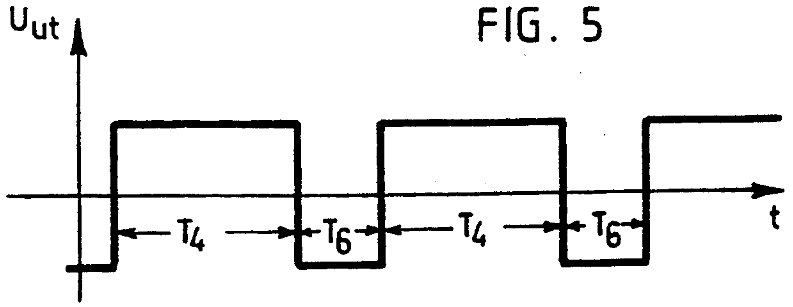

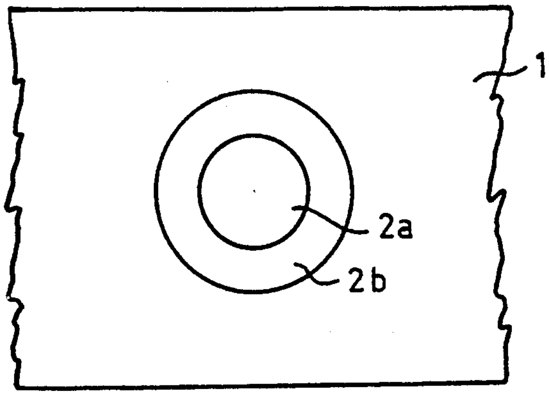
FIG. 1
FIG. 2
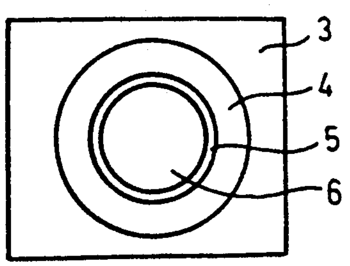
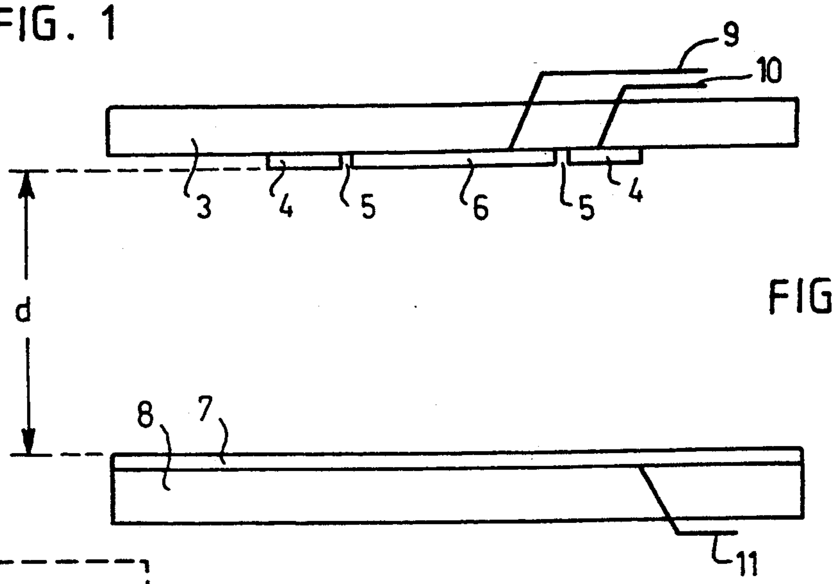
FIG. 3
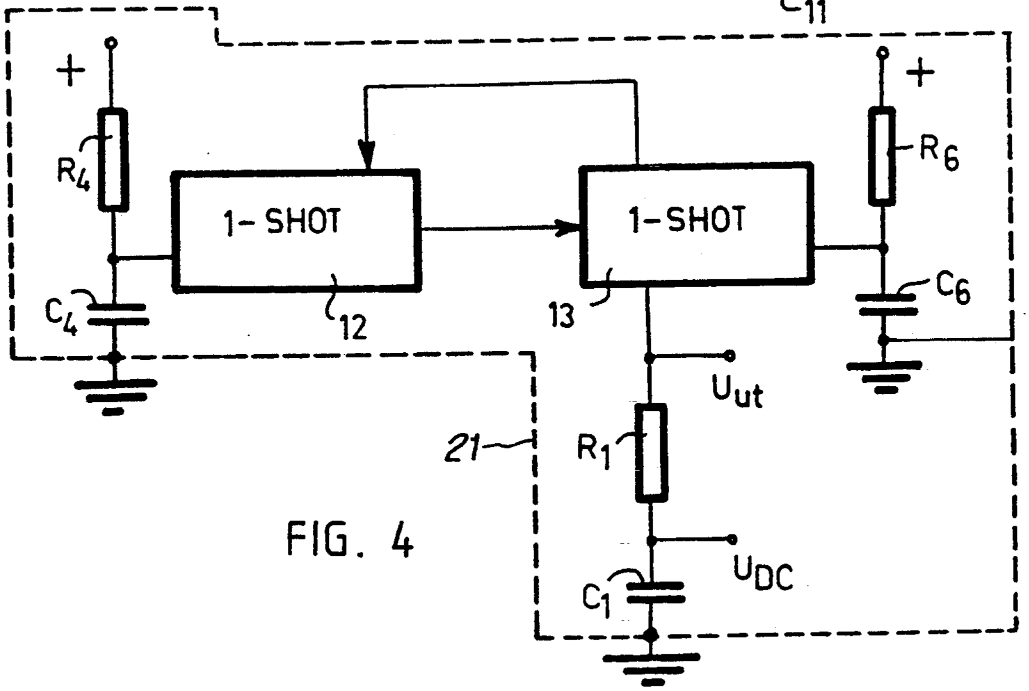
FIG. 4

SENSOR FOR VERIFICATION OF GENUINENESS OF SECURITY PAPER

The present invention concerns recognition and approval or rejection of a watermark in a paper note or a document. The pattern of the watermark must comprise a special feature, namely that it consists of two characteristically shaped neighbouring areas, whose thicknesses differ in being both thicker and thinner than the average thickness of the note in the watermark region, while the words, area density (mass per unit area) and thickness are variable quantities, while mass density is constant. This as opposed to a usual form of counterfeit watermark, which is made by pressing the sheet together in order to give a variable thickness. In this case mass density and thickness will vary in an inverse relationship, while area density stays constant. A genuine watermark is formed by "thickness modulation" during the paper production process, so that mass density of the paper stays constant.

If the paper note is equipped with an implanted security thread for verification of genuineness, this thread may also serve as a usable test object in a variant of the present invention. Such a security thread may consist of metal, metallized plastics, plastics of a similar material.

There has for quite some time existed a need of a fast and reliable method of verification of genuineness of banknotes and documents in connection with the banknote testing in national banks, and also in a smaller scale, for instance in banknote operated vending machines.

There has been made attempts to solve this problem by the use of optical techniques, but modern copying engineering is capable of fooling most of the optical detection methods. The watermark is still regarded to be an adequate and safe way of marking a genuine note, and a mechanical measurement of thickness has previously been used in testing watermarks. However, this technique is not well suited to a rapid machine procedure, and is not very useful when the note has small injuries distributed at random. Besides, the thickness modulation of a watermark may be initiated relatively simply as explained above.

However, Swedish laid-open publication No. 355,428 discloses a measuring technique which is based upon the fact that the capacitance of an air plate capacitor is changed when for instance a paper note is pushed into the air space between the electrode plates. The paper thickness, or rather the area density of the paper, is related to the capacitance that is sensed. A specially designed capacitor is used, in which one of the electrodes has the same shape as for example a thickened part of the sought watermark. A dynamic measurement of capacitance is made while the note is led through the capacitor. If a correct watermark passes the adjusted electrode, capacitance will increase abruptly before and decrease equally abruptly after a maximum which is reached just at coincidence. The graph showing the capacitance change (as a function of time or position of the note) should have a special appearance to be approved according to particular condition, or else rejected. The Swedish publication also hints at the possibility of making a double such analysis, first one for a thickened pattern, and thereafter one for a thinned pattern, which will usually belong to the same watermark.

The capacitive sensor device mentioned above suffers, however, from a few drawbacks or weaknesses:

Firstly, this device is unable to see the difference between thin and thick paper sheets. The reason for this is that the measurement has a dynamic character and only detects the change in capacitance as the watermark passes the sensor. A signal indicating absolute thickness of the paper will therefore not appear, only one indicating only one indicating changes of thickness. Thus paper quality cannot be investigated while the note is passing. Nor will a double or possibly multiple paper feeding, with a number of paper simultaneously, be detected by this device.

Electrically both the capacitor electrodes of the known sensor device are arranged "floating" relative to ground, which entails problems concerning stability and influence by external electromagnetic fields.

The most important weakness about the known device is, however, that the dynamic measuring principle which is used, implies that the sensor device may be fooled by for example a hole in the watermark region, which may be interpreted as an acceptable watermark. It is supposed that this must be a main reason why the mentioned sensor device has not achieved a wide recognition, or has been put into use by a majority of manufacturers of vending machines or note testing machines.

Additionally, the prior art sensor device seems to have an unnecessarily complicated structure, and it must be constructed as a double device in order to test a normal watermark, which has both thinned and thickened parts.

Using the method and the apparatus according to the present invention, it is achieved that a genuine watermark will be recognized, while a counterfeit, imprinted imitation mark will produce a deviating signal. It is further achieved that only a correctly designed watermark will yield a recognition signal, while holes in the paper or other, differently formed thickness modulations of the paper will be easily detected. (A hole shall for example entail a capacitance measurement which deviates in both positive and negative directions when the hole's edges are in the sensor area, contrary to the prior art device, which is only able to give a positive signal when there is a change in capacitance value.) Besides, an absolute measurement of the paper thickness or quality may be brought about. Such an absolute thickness measurement also gives the apparatus of the invention the advantage that the occurrence of double feeding or possibly several paper notes on top of each other, is measure just like a correspondingly thicker paper, and such an occurrence may consequently be pointed out in a simple manner. This is a feature which may be useful in many instances. Additionally, one rapidly and simply achieves a measurement which comprises both thick and thin parts of a watermark. An implanted metal thread may also be recognized.

These and other advantages are obtained by a method for approving a banknote or a document with a watermark, the pattern of said watermark consisting of two characteristically shaped neighbouring areas with a local area density (mass per unit area) which is markedly higher resp. lower than the principal average area density of said note in the watermark region, the method being characterized in that said watermark of said banknote or document, or characteristic sections thereof, is brought to a position corresponding with a two-part, doubly active capacitive sensor device, which sensor device consists of a common, flat metal plate as one capacitor side, which metal plate may be connected to ground, said sensor device at the other capacitor side being divided into two metal plates situated both in the same plane, said two plates being adapted in shape to each one of said two characteristically shaped neighbouring areas or characteristic sections thereof and being electrically separated, however with insignificant separation distance compared to the other areawise dimensions of said two plates, whereby a preset symmetry property of the double output signal from said sensor device is disturbed in a predetermined manner when a correct watermark coincides with the two sensor plates, which symmetry property is continuously monitored by signal processing equipment connected to said sensor device, which method also appears from patent claim 1 below.

Further advantages are attained using a method and a device as stated in the additional claims.

In some cases the paper thickness may exhibit relatively strong variations, distributed at random over the area of the note. It may be advantageous then to use only a part of the watermark instead of the whole, to achieve greater safety against influence on the measurement from these random variations of thickness. It is possible to select a "characteristic section" of the watermark, observing that this section includes both thickened and thinned areas of the watermark. This part of the watermark should obviously not be made too small since characteristic features of the watermark pattern then will disappear, and also the measurement signal (capacitance) will be too small.

A "two-part, doubly active capacitive sensor" is primarily intended to mean a capacitor of plate type with air as a dielectric, one capacitor side having a metal electrode plate which has been cut into two parts, and where the two parts are used in a quite equivalent manner in measuring capacitance against the single, common electrode plate situated on the other capacitor side. This is quite distinct from a case as disclosed for example in the previously mentioned Swedish laid-open publication No. 355.428, where a two-part capacitor plate occurs, but only one central part is active in the sense of "measuring capacitance", while other outer part serves to guide the electrical field lines, i.e. it is a so-called "guard ring".

Figure 6:
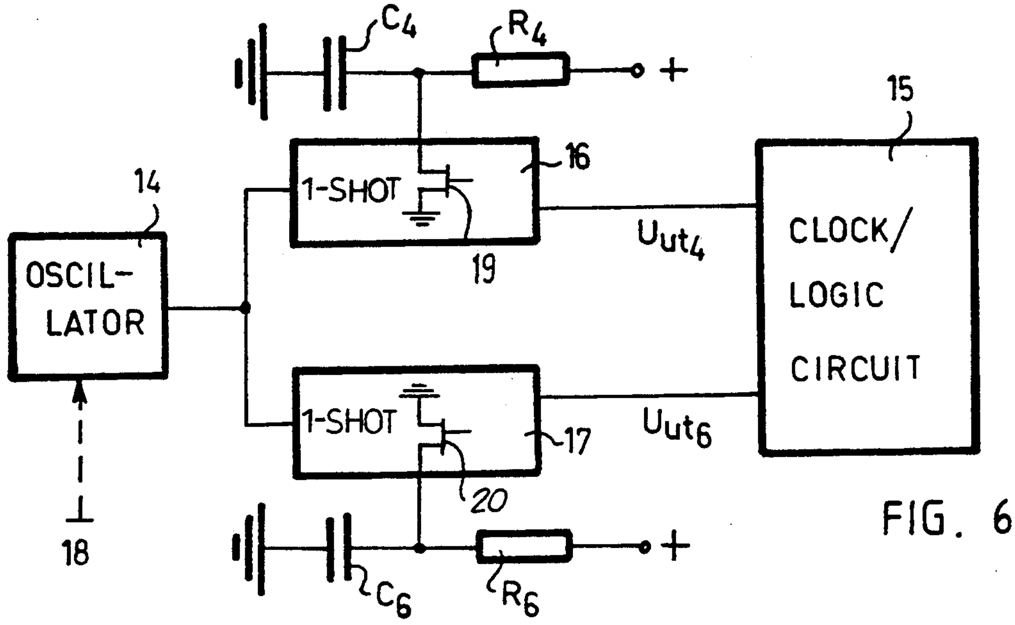
Figure 7:
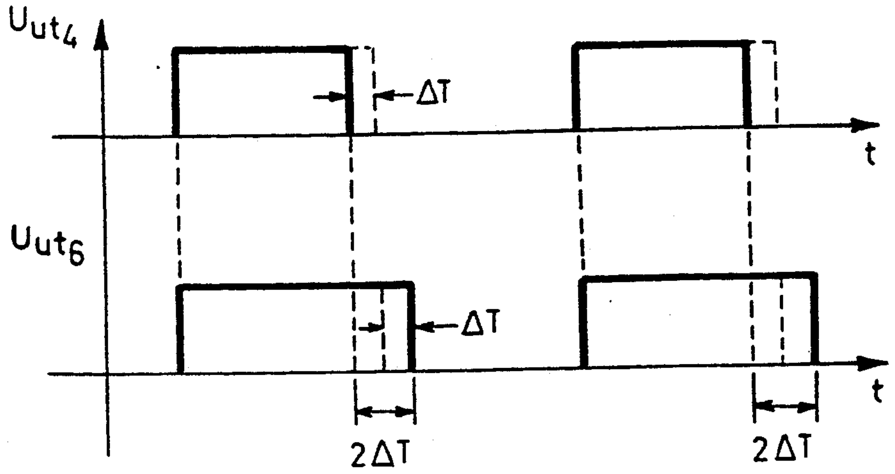

The invention will now be described closer, referring to the enclosed drawings, where FIG. 1 shows part of a paper note including an imagined genuine watermark, FIG. 2 shows an upper, double capacitor plate constructed according to the invention to detect the imagined watermark, FIG. 3 shows all of the two-part capacitor according to the invention, with the upper and lower plate in a sidewise view, FIG. 4 shows an example of an electrical signal processing circuit in accordance with the invention, including the two-part capacitor, FIG. 5 shows one particular shape of the output signal from a section of the signal processing circuit of FIG. 4, FIG. 6 shows another example of an electrical signal processing circuit in accordance with the invention, and FIG. 7 shows one shape of output signals from parts of the signal processing circuit of FIG. 6.

FIG. 1 shows part of a paper note 1 comprising a genuine watermark 2*a*, 2*b* with a particular picturewise design, in this case two concentric circular areas 2*a* and 2*b*. Generally the watermark may of course have a much more complicated design, but a circular shape has been selected here for simplicity.

The watermark has been formed in the paper production process, and consists of one thick area 2*a* with thickness $T+\Delta T$ and one thinned area 2*b* with thickness $T-\Delta T$, the paper having an average thickness of T around the watermark. Local mass density is mainly constant all over the paper, which paper is manufactured to be homogenous. Thus local area density, i.e. mass per unit area, is increased in the thick area 2*a*, while local area density is low in area 2*b*.

As opposed hereto, it must be remarked that a paper carrying an imprinted pattern of the same design, shows a variable mass density and constant area density.

It is an empirical fact that an imprinted (that is counterfeit) mark, in spite of thickness variation of a correct character, gives a practically constant capacitance when led in between two capacitor plates, owing to the constant area density. On the contrary, a genuine watermark having variable area density gives a variable capacitance contribution, which is proportional to area density and easily detectable.

FIG. 2 shows the two-part electrode plate of the capacitor. As an example the plate may consist of a glass fiber print board 3 with a pattern etched in metal, preferably copper, the pattern being adapted in shape to the pattern shown in FIG. 1. An inner circular area 6 of copper has substantially the same diameter as area 2*a*. An outer ring 4 of copper has mainly the same measures as area 2*b*. The circular area 6 and the annular area 4 are separated by a small spacing 5. As an example the width of the spacing 5 may be 0.1 mm for diameters of 10.0 mm and 14.3 nm: respectively belonging to inner circular area 6 and outer circumference of area 4. (These diameters give equal areas for the two parts, which may be practical, however not necessary.)

In FIG. 3 the glass fiber print board 3 is found again, with copper areas 4 and 6 constituting one capacitor side of the two-part capacitor which is seen in a side view. The opposite capacitor side has one common copper electrode 7 situated on a glass fiber board 8. Electrical conductors are shown schematically at 9, 10 and 11, however, these should be made as short as possible. The distance d between the capacitor plates is selected appropriately in relation to the maximum allowable paper thickness, for example a distance d equal to about 0.2 mm. An example of a well suited signal processing circuit for the recognition of a correct watermark is shown in FIG. 4. The two-part capacitors which are constituted by area 4 and common electrode 7, and area 6 and common electrode 7, are represented in FIG. 4 by the capacitances $C_4$ and $C_6$ respectively. Suitable resistances $R_4$ and $R_6$, together with said capacitances, provide a components determining time constants in order to define the durations $T_4$ and $T_6$ of the unstable states of each component respective of two so-called "oneshot" multivibrators 12 and 13, which are mutually interconnected. An output signal $U_{ut}$ which may be outputted from one of the multivibrators, will vary as shown in FIG. 5. The signal is a typical square signal with a rapid change between two constant voltage levels. The times during which the signal stays in each of the levels between changes, are respectively $T_4$ and $T_6$.

With an appropriate choice of parameter magnitudes, i.e. size of electrode areas 4 and 6, as well as resistance values of resistors $R_4$ and $R_6$, $T_4$ and $T_6$ may for example be given equal duration when a paper without a watermark, that is with an even thickness, is put into the capacitors. In this case the output signal $U_{ut}$ will be a symmetrical square signal, $T_4$ being equal to $T_6$. As soon as the two capacitances $C_4$ and $C_6$ change their values each in a different direction, a pronounced deviation of the symmetry of the square signal is obtained, for instance into a shape like that shown in FIG. 5, where $T_4$ and $T_6$ are unequal.

As long as $U_{ut}$ is symmetrical, its average value is situated halfway between the two voltage levels, for example at 0 volts. With a non-symmetrical signal owing to imbalance between the capacitance values $C_4$ and $C_6$, a deviating average value is obtained, which average value in the case of a correct watermark brought to a correct and corresponding sensor position, is one particular maximum value.

A simple means for obtaining such an average value is a low-pass filter, outlined in FIG. 4 as a resistance $R_1$ and a capacitance $C_1$. The voltage $U_{DC}$ is thus a DC voltage representing the average value of $U_{ut}$. A genuine watermark may be recognized by measuring $U_{DC}$, if the areas 4 and 6 of the capacitor plates have been designed properly in accordance with the shape of the watermark, or in accordance with a characteristic part of the watermark.

It will be very difficult to bring about a correct DC voltage $U_{DC}$ in any other way than by having a correct watermark coincide with the pattern electrode plates 4 and 6. Security is based upon exactly this, that maximum imbalance between capacitances, which is a necessity for approval, is obtained only at such a coincidence.

In order to obtain a high degree of security against unwanted influence by external electrical fields (noise), and to avoid crosstalk between the two successively proceeding capacitance measurements (alternately plate 4 and 6), it is advantageous to have each oneshot multivibrator capacitance input connected to an inside transistor, shown symbolically as transistors 19 and 20 in FIG. 6, which is short-circuited to ground during all of the stable period parts between each unstable interval. Thereby is achieved:

(a) that the part-capacitor which at the moment is not being measured, is grounded, so that only field lines from the presently active plate penetrate the paper and enter the common plate 7. This gives a minimum of crosstalk between the two measurements, since one part-capacitor is held at a steady potential while the other is charged and vice versa.

(b) that static electricity in the paper is conducted to ground, since the note all the time will make contact with ground potential areas on both sides of the paper.

Another example of a well suited signal processing circuit is shown in FIG. 6. Here the oneshot-multivibrators 16 and 17 are connected in parallel behind a square pulse oscillator 14 which triggers both multivibrators at the same time. The duration of the unstable voltage level for each one of the multivibrators 16 and $C_6$, which are connected to the multivibrators. At the outputs from the multivibrators, which are both connected to a clock/logic circuit 15, two square pulse trains are generated which are equal, i.e. timewise symmetrical, when the capacitors $C_4$ and $C_6$ have a paper of uniform thickness as dielectric, but deviate from each other in time symmetry when the area densities take on different values. Examples of curve shapes of the signals $U_{ut4}$ and $U_{ut6}$ can be found in FIG. 7. A certain degree of imbalance is shown here, pulse durations being different. The time difference $2\Delta T$ is timed by the clock/logic circuit 15, which thereafter compares this value with the desired value which corresponds to coincidence with a correct watermark.

The oscillator 14 may, if desired, be synchronized to an external process, for example in connection with entering the note into the test area with the capacitor plates. This is symbolized in FIG. 6 by reference number 18.

The last mentioned measuring method is rapid (within 10–100 $\mu s$) because of the digital measurement of time differences. However, a certain degree of crosstalk must be accepted in this case, since both of the capacitances are measured at the same time and the capacitor plates 4 and 6 are situated close by each other and have the counterelectrode 7 in common.

It is a common feature of both of said measuring circuits, which are only working with multivibrators "in phase or counterphase", that crosstalk between the two capacitances will not contain very much other than the change frequency itself. Thus a stabilization of the capacitance controlled stop triggering points of the multivibrators are secured. On the contrary, if the two multivibrators are running freely relative to each other, that is with unequal frequencies, there is a risk of superposing for instance a somewhat higher frequency upon the charge curve of one of the capacitances, giving uncertainty/unstability in the stop triggering point.

When the apparatus according to the invention is utilized, the following happens:

A note being investigated, is automatically moved into the air gap between the electrode plates of the two-part capacitor. In order to obtain maximum correspondence between the possibly correct watermark and the capacitor pattern, one of a number of well known techniques may be used. As an example, a number of equivalent capacitors may be placed in succession with a lateral off-set, whereby one of these capacitors achieves the necessary maximum correspondence, the variation field of the watermark position being known for the type of note in question. Or, the note may be moved laterally relative to the capacitor plates in accordance with a predetermined movement pattern which secures coincidence if the watermark is present. Such techniques are well known, as mentioned above, and do not constitute a part of the present invention.

At the moment when the edge of the note reaches the actual area of the capacitor, a small disturbance of the capacitance balance is obtained, in the opposite direction of the disturbance produced by a correct watermark, given that the electrode plates of the sensor has a favourable geometric design. When the paper of uniform thickness has entered the area of the shape adapted electrode plates completely, the capacitances $C_4$ and $C_6$ have been considerably changed due to the permittivity of the paper, but the symmetry is maintained. In the circuit variant shown in FIG. 4 the frequency of the square signal $U_{ut}$ decreases, but the DC signal $U_{DC}$ is unchanged, because the mean value of $U_{ut}$ is the same.

In the variant shown in FIG. 6 the pulse width of the unstable level will change, but equally for both signals. The clock/logic circuit 15 thus sees no time difference.

Now, if a forged mark of the imprinted type enters the capacitor area, the shape is correct, but as mentioned previously, the permittivity is about the same both for thick and thin areas, so that the necessary degree of assymmetry in capacitance values is not achieved, i.e. the mark is not accepted.

When a correct watermark hits the capacitor area, the correct imbalance in the square signal $U_{ut}$ is brought about, and with that the correct Dc voltage $U_{DC}$. This correct DC voltage then triggers further machinery in order to let the note through, while a rejected note will be pushed out another outlet in a well known manner per se. This referred to the variant of FIG. 4. Correspondingly a correct time difference $2\Delta T$ shall occur between the two unstable levels at the outputs from the multivibrators of FIG. 6, which time difference is interpreted by the clock/logic circuit as a correct watermark.

It must be remarked that notes with a few wrinkles or small tears do not cause problems for the operation of the device, such defects only influencing the capacitance to a quite insignificant degree.

It was previously mentioned that it might be advantageous to use only a characteristic part of the watermark for the measurements. In practice, preferably a watermark section is used which comprises areas of about equal sizes of a thinned and a thickened field, even though this is not imperative.

One must underline that the measuring method used in the present invention, which is in principle of a static character, entails numerous advantages. By "a static character" is to be understood that principally the banknote is lying still, the real capacitance being measured, not only the capacitance change as the note rushes by. The total capacitance is for instance related to the note thickness. Thus it will be possible to deduce the note thickness directly from the sum $T_4+T_6$, see FIG. 5. An obvious consequence is that said sum also indicate the occurrence of two or more paper notes on top of each other, so that a detection of a double or multiple feeding is also achieved in the same measurement.

Even if the measurement has a static character, it may be done very rapidly, adapted to a usual automatic note processing rate. An ordinary banknote may for instance be tested within less that 0,1 sec., including entering, positioning and capacitance determining with an indication of an approval or rejection signal.

A capacitive sensor of the type in question may also be used to recognize an implanted security thread in the paper, the thread being shaped in a particular way, possibly like a straight line. The dielectric constant of the security thread is markedly greater than that of the paper, making it possible to detect the thread with an extended and adapted electrode shape. The total paper thickness in this area is also greater than elsewhere. The capacitive sensor may thus be constructed for detecting both a watermark and a security thread at the same time.

Arranging two equivalent sensors in sequence, where on is mirror reversed relative to the other, makes detection of one particular type of forgery possible, namely a one-side mass addition, for example a piece of tape that is stuck on.

Since the electrical field lines from the shape adjusted electrodes 4 and 6 to the grounded common plate 7 do not stand perpendicular to the plates, i.e. the field is not homogenous, the capacitance changes will be noticeably different when the note is seen effectively from each side in the respective two measurements. The paper thickness occupies actually a substantial part of the air gap, and the picture of field lines through the added mass is substantially different, depending on whether this mass is closer to the grounded common plate 7 or the shape adapted electrode plates 4 and 6.

The following must be remarked about the construction of the practical apparatus:

In order to minimize noise problems, the grounded common plate 7 or the capacitor may be connected to a Faraday cage 21, as shown in FIG. 4, enclosing the apparatus. The cage must of course be fitted with the necessary openings for note entrance and exit. To achieve equal influence from temperature variations and external fields on both multivibrators, and to avoid stray capacitances, it is preferred to use an integrated circuit with two oneshot-multivibrators built together, and possibly the multivibrators may be formed in a quadruple operation amplifier chip. It is quite important to take care that the assymmetry in the measurements only originates from the capacitances being measured, and not from various external influences. The integrated circuit is preferably mounted upon the same print card 3 as the part-plates 4 and 6, in order to minimize wire capacitances.

As mentioned previously, the paper quality may be checked. As the note enters the sensor, that is before the watermark is in position, $U_{ut}$ in the circuit of FIG. 4 may be used as an indication. An acceptable paper quality corresponds to a particular sum $T_4+T_6$, which may be timed and checked with some suitable, per se known apparatus.

I claim:

1. A method for approving a document, such as a banknote (1) with a watermark (*2a*, *2b*), the pattern of said watermark consisting of two characteristically shaped neighbouring areas (*2a*, *2b*) with a local area density (mass per unit area) which is markedly both higher and lower than the principal average area density of said banknote (1) in the watermark region, whereby said watermark or at least a characteristic section thereof is brought to a position corresponding with a two-part capacitive sensor device (4, 6, 7), which sensor device consists of a common, flat metal plate (7) as one capacitor side and the other capacitor side is divided into two metal plates (4, 6) situated both in a common plane and being electrically separated, with insignificant separation distance (5) compared to the other areawise dimensions of said two plates (4, 6), and the change in capacitance caused by the watermark is observed and compared with a change caused by a correct watermark, characterized in that the watermark or said characteristic section thereof is brought in position with a doubly active capacitive sensor device (4, 6, 7) in which the two plates (4, 6) are situated in a common fixed plane and are adapted in shape to each one of said two characteristically shaped neighbouring areas (*2a*, *2b*) or said characteristic sections thereof, that a preset symmetry property of the double output signal from said sensor device is disturbed in a predetermined manner when a correct watermark coincides with the two sensor plates (4, 6), and that the symmetry property is continuously monitored by signal processing equipment connected to said sensor device.

2. A method as claimed in claim 1, further characterized in that the sensor device is arranged in such a way that the capacitances corresponding to said two metal plates (4, 6) are changed to increase and decrease respectively, a predetermined amount when an acceptable watermark is present.

3. A method as claimed in claim 1 or 2, further characterized in that the sensor capacitances influence circuit means (12, 13) comprised in the signal processing equipment into producing a square pulse train with a symmetry that is directly related to the capacitance values, wherein the pulse symmetry or assymmetry is detected by an average determining circuit ($R_1$, $C_1$).

4. A method as claimed in claim 3, further characterized in that two "one-shot" multivibrators (12, 13), which are comprised by said circuit means and have their respective time constants for the durations of their unstable level determined by each of the sensor capacitances ($C_4$, $C_6$), respectively, short circuit their capacitance inputs to ground by means of an internal active circuit element during every stable period part, whereby the momentarily non-active metal plate (4 or 6) of said other capacitor side is grounded and whereby static electricity is conducted away from the banknote.

5. A method as claimed in claim 4, further characterized in that the paper thickness, also including a possible occurrence of double or multiple banknote feeding, is determined on the basis of one complete time cycle of said square pulse train.

6. A method as claimed in claim 3, further characterized in that the paper thickness, also including a possible occurrence of double or multiple banknote feeding, is determined on the basis of one complete time cycle of said square pulse train.

7. A method as claimed in claim 1 or 2, further characterized in that sensor capacitances ($C_4$, $C_6$) influence circuit means (16, 17) comprised in the signal processing equipment into producing two square pulse trains at separate outputs, with a mutual time symmetry which is directly dependent on the capacitance values, wherein time symmetry or assymetry is detected by a clock-/logic circuit (15).

8. Device for approval of a document, such as a banknote (1) with a watermark (**2*a*, 2*b*), the pattern of said watermark consisting of two characteristically shaped neighbouring areas (2*a*, 2*b*) with a local area density (mass per unit area) which is markedly both higher and lower than the principal average area density of said banknote (1) in the watermark region, the device comprising a shape-adapted, two-part capacitive sensor device (4, 6, 7) and signal processing equipment connected to the sensor device, said sensor device (4, 6, 7) consisting of one common, flat metal plate (7) on one capacitor side and two metal plates (4, 6) on the other capacitor side situated both in a common plane and electrically separated from each other, with insignificant separation distance (5) compared to the other areawise dimensions of said two plates (4, 6), characterized in that said sensor device (4, 6, 7) is a doubly active capacitive sensor device, that said two plates (4, 6) are situated in a common plane and are adapted in shape to each one of said two characteristically shaped neighbouring areas (2*a*, 2*b*) or characteristic sections thereof and that said signal processing equipment comprises circuit means (12, 13, $R_4$, $R_6$, $R_1$, $C_1$) for continuous monitoring of a preset symmetry property of the double output signal from the sensor device (4, 6, 7**).

9. Device as claimed in claim 8, further characterized in that said common metal plate (7) is adapted to be connected to a grounded Faraday cage enclosing the whole device, leaving only necessary openings for entrance and exit of said note (1).

10. Device as claimed in claim 8 or 9, further characterized in that said circuit means comprise two interconnected "one-shot" multivibrators (12, 13), each multivibrator having its time constant determined by appropriate connections to the respective two parts of said two-part sensor device, said double output signal from said sensor device being defined as the output signal ($U_{ut}$) from one (13) of said multivibrators, wherein the output signal may, physical parameters of said circuit means having been adjusted, have the shape of a symmetrical square signal when the sensor device detects a region without a watermark, but has its time course disturbed in a predetermined manner in the presence of a correct watermark.

11. Device as claimed in claim 10, further characterized in that the capacitance inputs of said multivibrators (12, 13) are adapted to be short circuited to ground via an internal active circuit element during every stable period part.

12. Device as claimed in claim 11, further characterized in that said one-shot multivibrators are encapsulated in one and the same integrated circuit and mounted close to said sensor device, preferably on a common print card (3) comprising said two metal plates (4, 6).

13. Device as claimed in claim 12, further characterized in that said two metal plates (4, 6) of said sensor device additionally are constructed with a shape adaptation for capacitive detection of an implanted security thread in the banknote, said security thread consisting of a metal, metallized plastics, plastics, or a similar material.

14. Device as claimed in claim 12, further characterized in that said two metal plates (4, 6) are designed so that the sensor device, at the moment when the leading edge of the banknote (1) enters the sensor area, produces a disturbance of balance in the opposite direction of the disturbance produced by a correct watermark brought to a coinciding position with said two metal plates (4, 6).

15. Device as claimed in claim 12, further characterized by a further shape adapted capacitive sensor device, arranged in series behind the first mentioned sensor device, however with capacitor plates inverted relative to the plates of the first mentioned sensor device, so that the shape adapted capacitor plates (4, 6) of the first mentioned sensor device are situated on one side of the banknote and of the further sensor device are situated on the other side of the banknote.

16. Device as claimed in claim 11, further characterized in that said circuit means further comprise a circuit ($R_1$, $C_1$) for determining the average value ($U_{DC}$) of said output signal ($U_{ut}$).

17. Device as claimed in claim 16, further characterized in that said two metal plates (4, 6) of said sensor device additionally are constructed with a shape adaptation for capacitive detection of an implanted security thread in the banknote, said security thread consisting of a metal, metallized plastics, plastics, or a similar material.

18. Device as claimed in claim 16, further characterized in that said two metal plates (4, 6) are designed so that the sensor device, at the moment when the leading edge of the banknote (1) enters the sensor area, produces a disturbance of balance in the opposite direction of the disturbance produced by a correct watermark brought to a coinciding position with said two metal plates (4, 6).

19. Device as claimed in claim 16, further characterized by a further shape adapted capacitive sensor device, arranged in series behind the first mentioned sensor device, however with capacitor plates inverted relative to the plates of the first mentioned sensor device, so that the shape adapted capacitor plates (4, 6) of the first mentioned sensor device are situated on one side of the banknote and of the further sensor device are situated on the other side of the banknote.

20. Device as claimed in claim 11, further characterized in that said two metal plates (4, 6) of said sensor device additionally are constructed with a shape adaptation for capacitive detection of an implanted security thread in the banknote, said security thread consisting of a metal, metallized plastics, plastics, or a similar material.

21. Device as claimed in claim 11, further characterized in that said two metal plates (4, 6) are designed so that the sensor device, at the moment when the leading edge of the banknote (1) enters the sensor area, produces a disturbance of balance in the opposite direction of the disturbance produced by a correct watermark brought to a coinciding position with said two metal plates (4, 6).

22. Device as claimed in claim 11, further characterized by a further shape adapted capacitive sensor device, arranged in series behind the first mentioned sensor device, however with capacitor plates inverted relative to the plates of the first mentioned sensor device, so that the shape adapted capacitor plates (4, 6) of the first mentioned sensor device are situated on one side of the banknote and of the further sensor device are situated on the other side of the banknote.

23. Device as claimed in claim 18, further characterized in that said circuit means further comprise a circuit ($R_1$, $C_1$) for determining the average value ($U_{DC}$) of said output signal ($U_{ut}$).

24. Device as claimed in claim 23, further characterized in that said one-shot multivibrators are encapsulated in one and the same integrated circuit and mounted close to said sensor device, preferably on a common print card (3) comprising said two metal plates (4, 6).

25. Device as claimed in claim 24, further characterized in that said two metal plates (4, 6) of said sensor device additionally are constructed with a shape adaptation for capacitive detection of an implanted security thread in the banknote, said security thread consisting of a metal, metallized plastics, plastics, or a similar material.

26. Device as claimed in claim 24, further characterized in that said two metal plates (4,6) are designed so that the sensor device, at the moment when the leading edge of the banknote (1) enters the sensor area, produces a disturbance of balance in the opposite direction of the disturbance produced by a correct watermark brought to a coinciding position with said two metal plates (4, 6).

27. Device as claimed in claim 24, further characterized by a further shape adapted capacitive sensor device, arranged in series behind the first mentioned sensor device, however with capacitor plates inverted relative to the plates of the first mentioned sensor device, so that the shape adapted capacitor plates (4, 6) of the first mentioned sensor device are situated on one side of the banknote and of the further sensor device are situated on the other side of the banknote.

28. Device as claimed in claim 23, further characterized in that said two metal plates (4, 6) of said sensor device additionally are constructed with a shape adaptation for capacitive detection of an implanted security threaded in the banknote, said security thread consisting of a metal, metallized plastics, plastics, or a similar material.

29. Device as claimed in claim 23, further characterized in that said two metal plates (4, 6) are designed so that the sensor device, at the moment when the leading edge of the banknote (1) enters the sensor area, produces a disturbance of balance in the opposite direction of the disturbance produced by a correct watermark brought to a coinciding position with said two metal plates (4, 6).

30. Device as claimed in claim 23, further characterized by a further shape adapted capacitive sensor device, arranged in series behind the first mentioned sensor device, however with capacitor plates inverted relative to the plates of the first mentioned sensor device, so that the shape adapted capacitor plates (4, 6) of the first mentioned sensor device are situated on one side of the banknote and of the further sensor device are situated on the other side of the banknote.

31. Device as claimed in claim 10, further characterized in that said oneshot multivibrator are encapsulated in one and the same integrated circuit and mounted close to said sensor device, preferably on a common print card (3) comprising said two metal plates (4, 6).

32. Device as claimed in claim 31, further characterized in that said two metal plates (4, 6) of said sensor device additionally are constructed with a shape adaptation for capacitive detection of an implanted security thread in the banknote, said security thread consisting of a metal, metallized plastics, plastics, or a similar material.

33. Device as claimed in claim 31, further characterized in that said two metal plates (4, 6) are designed so that the sensor device, at the moment when the leading edge of the banknote (1) enters the sensor area, produces a disturbance of balance in the opposite direction of the disturbance produced by a correct watermark brought to a coinciding position with said two metal plates (4, 6).

34. Device as claimed in claim 31, further characterized by a further shape adapted capacitive sensor device, arranged in series behind the first mentioned sensor device, however with capacitor plates inverted relative to the plates of the first mentioned sensor device, so that the shape adapted capacitor plates (4, 6) of the first mentioned sensor device are situated on one side of the banknote and of the further sensor device are situated on the other side of the banknote.

35. Device as claimed in claim 10, further characterized in that said two metal plates (4, 6) of said sensor device additionally are constructed with a shape adaptation for capacitive detection of an implanted security thread in the banknote, said security thread consisting of a metal, metallized plastics, plastics, or a similar material.

36. Device as claimed in claim 10, further characterized in that said two metal plates (4, 6) are designed to that the sensor device, at the moment when the leading edge of the banknote (1) enters the sensor area, produces a disturbance of balance in the opposite direction of the disturbance produced by a correct watermark brought to a coinciding position with said two metal plates (4, 6).

37. Device as claimed in claim 10, further characterized by a further shape adapted capacitive sensor device, arranged in series behind the first mentioned sensor device, however with capacitor plates inverted relative to the plates of the first mentioned sensor device, so that the shape adapted capacitor plates (4, 6) of the first mentioned sensor device are situated on one side of the banknote and of the further sensor device are situated on the other side of the banknote.

38. Device as claimed in claim 8 or 9, further characterized in that said circuit means comprise two "one-shot" multivibrators (16, 17) connected in parallel, each multivibrator having its time constant determined by appropriate connections to the respective two parts of said two-part capacitive sensor device, wherein the multivibrators are adapted to be triggered synchronously by a square pulse oscillator (14) and to deliver each an output signal ($U_{ut4}$, $U_{ut6}$) to a clock/logic circuit (15) which is adapted to measure the degree of time symmetry or assymmetry between the two output signals.

39. Device as claimed in claim 38, further characterized in that said one-shot multivibrators are encapsulated in one and the same integrated circuit and mounted close to said sensor device, preferably on a common print card (3) comprising said two metal plates (4, 6).

40. Device as claimed in claim 39, further characterized in that said two metal plates (4, 6) of said sensor device additionally are constructed with a shape adaptation for capacitive detection of an implanted security thread in the banknote, said security thread consisting of a metal, metallized plastics, plastics, or a similar material.

41. Device as claimed in claim 39, further characterized in that said two metal plates (4, 6) are designed so that the sensor device, at the moment when the leading edge of the banknote (1) enters the sensor area, produces a disturbance of balance in the opposite direction of the disturbance produced by a correct watermark brought to a coinciding position with said two metal plates (4, 6).

42. Device as claimed in claim 39, further characterized by a further shape adapted capacitive sensor device, arranged in series behind the first mentioned sensor device, however with capacitor plates inverted relative to the plates of the first mentioned sensor device, so that the shape adapted capacitor plates (4, 6) of the first mentioned sensor device are situated on one side of the banknote and of the further sensor device are situated on the other side of the banknote.

43. Device as claimed in claim 38, further characterized in that said two metal plates (4, 6) of said sensor device additionally are constructed with a shape adaptation for capacitive detection of an implanted security thread in the banknote, said security thread consisting of a metal, metallized plastics, plastics, or a similar material.

44. Device as claimed in claim 38, further characterized in that said two metal plates (4, 6) are designed so that the sensor device, at the moment when the leading edge of the banknote (1) enters the sensor area, produces a disturbance of balance in the opposite direction of the disturbance produced by a correct watermark brought to a coinciding position with said two metal plates (4, 6).

45. Device as claimed in claim 38, further characterized by a further shape adapted capacitive sensor device, arranged in series behind the first mentioned sensor device, however with capacitor plates inverted relative to the plates of the first mentioned sensor device, so that the shape adapted capacitor plates (4, 6) of the first mentioned sensor device are situated on one side of the banknote and of the further sensor device are situated on the other side of the banknote.

46. Device as claimed in one of claims 8 or 9, further characterized in that said two metal plates (4, 6) of said sensor device additionally are constructed with a shape adaptation for capacitive detection of an implanted security thread in the banknote, said security thread consisting of a metal, metallized plastics, plastics, or a similar material.

47. Device as claimed in claim 46, further characterized in that said two metal plates (4, 6) are designed so that the sensor device, at the moment when the leading edge of the banknote (1) enters the sensor area, produces a disturbance of balance in the opposite direction of the disturbance produced by a correct watermark brought to a coinciding position with said two metal plates (4, 6).

48. Device as claimed in one of claims 8 or 9, further characterized in that said two metal plates (4, 6) are designed so that the sensor device, at the moment when the leading edge of the banknote (1) enters the sensor area, produces a disturbance of balance in the opposite direction of the disturbance produced by a correct watermark brought to coinciding position with said two metal plates (4, 6).

49. Device as claimed in claim 48, further characterized by a further shape adapted capacitive sensor device, arranged in series behind the first mentioned sensor device, however with capacitor plates inverted relative to the plates of the first mentioned sensor device, so that the shape adapted capacitor plates (4, 6) of the first mentioned sensor device are situated on one side of the banknote and of the further sensor device are situated on the other side of the banknote.

50. Device as claimed in claim 8 or 9, further characterized by a further shape adapted capacitive sensor device, arranged in series behind the first mentioned sensor device, however with capacitor plates inverted relative to the plates of the first mentioned sensor device, so that the shape adapted capacitor plates (4, 6) of the first mentioned sensor device are situated on one side of the banknote and of the further sensor device are situated on the other side of the banknote.

* * * * *